United States Patent [19]

Estrada et al.

[11] Patent Number: 4,943,741
[45] Date of Patent: Jul. 24, 1990

[54] ECL/CML EMITTER FOLLOWER CURRENT SWITCH CIRCUIT

[75] Inventors: Julio R. Estrada, South Portland; Roy L. Yarbrough, Hiram, both of Me.

[73] Assignee: National Semiconductor Corporation, Santa Clara, Calif.

[21] Appl. No.: 356,785

[22] Filed: May 24, 1989

[51] Int. Cl.⁵ .................... H03K 19/086; H03K 3/284
[52] U.S. Cl. ................................. 307/455; 307/458; 307/272.1; 307/546
[58] Field of Search ............... 307/443, 455, 458, 530, 307/542, 546, 272.1

[56] References Cited
U.S. PATENT DOCUMENTS
4,593,211  6/1986 Belforte ................ 307/455

Primary Examiner—Andrew J. James
Assistant Examiner—M. Wambach
Attorney, Agent, or Firm—Lee Patch; Daniel H. Kane

[57] ABSTRACT

An emitter follower current switch circuit is provided for emitter coupled logic or current mode logic (ECL/CML) circuits having output buffer emitter follower transistor elements which source true and complementary output signals of high and low potential to respective true and complementary outputs of the ECL/CML gate. The emitter follower current switch circuit effectively disconnects the output current sink from and ECL/CML gate output and corresponding output buffer emitter follower transistor element when the corresponding output is at high potential. At each output a current switch transistor element is coupled between the respective output buffer emitter follower transistor element and the output current sink. A control circuit controls the conducting state of the current switch transistor element so that it is on (conducting) or off (non-conducting) for corresponding output signals of low and high potential respectively. Cross control circuits are provided so that the current switch transistor element for the true output is controlled by the complementary output signal potential level and the current switch transistor element for the complementary output is controlled by the true output signal potential level.

9 Claims, 2 Drawing Sheets

ECL/CML EMITTER FOLLOWER CURRENT SWITCH CIRCUIT

TECHNICAL FIELD

This invention relates to emitter coupled logic and current mode logic (ECL/CML) gates and circuits utilizing emitter follower transistor element output buffers and respective current sinks. In particular the invention relates to a new emitter follower current switch circuit for increasing switching speed and reducing power dissipation in ECL/CML gates and circuits.

BACKGROUND ART

A standard ECL output gate circuit, illustrated in FIG. 1, includes a pair of ECL gate transistors Q1 and Q2. In this example transistor Q1 provides an input transistor element for receiving input signals of high and low potential. Transistor Q2 provides a reference transistor element to which a reference voltage signal is applied at an intermediate reference voltage level between the high and low potential input signal levels. The emitter terminals of transistors Q1 and Q2 are coupled together at a common emitter node coupling. Current sink I1, coupled between the common emitter node coupling and ground orlow potential GND generates the tail current. The current sink I1 is typically a current source transistor with a tail resistor in its emitter current path generating the tail current. A bias voltage generator, not shown, provides the current source voltage applied to the base current source transistor.

The ECL gate transistors Q1 and Q2 provide alternative current paths through respective collector path swing voltage resistors R2 and R3 which are in turn coupled through common resistor element R1 to the high potential power supply $V_{cc}$. Typically, the ECL gate resistor elements R1, R2, and R3 have substantially equal resistance. Current sink I1 generates the ECL gate current in the alternative current paths through swing resistors R2 or R3 according to the input signal $V_{in}$ at the base of input transistor element Q1.

Typical ECL gates may also be constructed according to the differential signal input configuration. In the differential signal input ECL gate circuit configuration, the gate transistors Q1 and Q2 constitute differential input transistors for differential or complementary inputs $V_{in}$ and $V_{in}$, rather than functioning as input transistor and reference transistor as illustrated in FIG. 1.

As further shown in FIG. 1, complementary ECL gate output signals are taken from the collector nodes of the ECL gate transistors Q1 and Q2. In this example the true output signal OUT or $V_o$ is taken from the collector node of reference transistor Q2. The complementary output signal OUTN or $V_o$ is taken from the collector node of input transistor element Q1. The output signals from the collector nodes of ECL gate transistors Q1 and Q2 are sourced respectively through output buffer emitter follower transistor elements Q3 and Q4 to the respective complementary and true outputs, OUTN and OUT.

The output buffer transistors Q3 and Q4 are coupled in emitter follower configuration between the high potential power supply $V_{cc}$ and the respective current sinks I2 and I3. The output buffer emitter follower transistor elements Q3 and Q4 provide impedance transformation and matching between the ECL gate and output circuits to which the respective complementary and true outputs OUTN and OUT are coupled.

A disadvantage of the conventional ECL output gate is that each of the output buffer emitter follower transistor elements Q3 and Q4 must source current both to the respective output OUTN or OUT and the respective current sink I2 or I3 when pulling up the output for transition from low to high potential at the output. The output load is therefore deprived of the charging current required to feed the current sink with resulting decrease in switching speed during the low to high transition. During the stationary state or standby condition there is also substantial power dissipation. Furthermore during a high to low transition at the output, the respective current sink I2 or I3 is required to sink both the discharge current from the output load and the sourcing current from the respective emitter follower Q3 or Q4. Because of the limited current sinking capability of current sinks I2 and I3, the discharge time for transition from high to low potential is substantially prolonged.

OBJECTS OF THE INVENTION

It is therefore an object of the present invention to provide a new ECL/CML output gate with output buffer emitter follower transistor elements in which an emitter follower transistor element may be substantially disconnected from the respective current sink while sourcing a signal of high potential to the respective output. Thus it is only necessary for the output buffer emitter follower transistor element to pullup the respective output and not the respective current sink during transition from low to high potential at the output and for the duration of the high potential output.

Another object of the invention is to provide an improved ECL output gate utilizing output buffer emitter follower transistor elements with a current sink in which the current sink may be constructed with greater current sinking capacity than conventional devices. As a result the current sink can pull down the output and corresponding emitter follower transistor element with increased speed.

A further object of the invention is to provide an emitter follower current switch and current switch control circuit for incorporation in emitter follower circuit configurations for disconnecting an emitter follower transistor element from its corresponding current sink according to the control signals of the control circuit.

Disclosure of the Invention

In order to accomplish these results the present invention provides an improved ECL/CML circuit with at least one active switching node providing output signals of high and low potential through an emitter follower transistor element to a respective output. An emitter follower current switch circuit is incorporated in the ECL/CML gate. The emitter follower current switch circuit includes a current switch transistor element operatively coupled between the emitter follower transistor element and the respective output current sink. A control circuit is arranged and coupled for controlling the conducting state of the current switch transistor element so that it is on (conducting) and off (non-conducting) for output signals of low and high potential respectively. The emitter follower transistor element and respective output are thereby substantially disconnected from the output current sink when the output is at high potential, and during transition from low to high potential at the output. The current sink is provided with enhanced current sinking capacity for increased switching speed while sinking current from the output and respective output buffer emitter follower transistor element during transition from high to low potential at the respective output.

In the full ECL/CML circuit, first and second output nodes provide true and complementary output signals of high and low potential. Output buffer first and second emitter follower transistor elements are coupled respectively to the first and second output nodes for sourcing output signals to the respective true and complementary outputs. At least one output current sink is arranged for sinking current from the true output and first emitter follower transistor element and from the complementary output and second emitter follower transistor element.

According to the invention a first current switch transistor element is coupled between the first emitter follower transistor element and the output current sink. A first cross-control circuit is coupled between the second emitter follower transistor element and the first current switch transistor element for controlling the conducting state of the first current switch transistor element so that it is on (conducting) and off (non-conducting) for complementary output signals of high and low potential respectively.

A second current switch transistor element is operatively coupled between the second emitter follower transistor element and the output current sink. A second cross-control circuit is coupled between the first emitter follower transistor element and the second current switch transistor element for controlling the conducting state of the second current switch transistor element so that it is on (conducting) and off (non-conducting) for true output signals of high and low potential respectively.

A feature and advantage of this arrangement is that whichever of the outputs, the true or complementary output is at high potential, it is substantially disconnected from the output current sink. On the other hand, whichever output, the true or complementary output is at low potential, it is substantially connected to the output current sink. As a result the speed of AC switching and transition from low to high potential at the output is substantially enhanced. The increased current sinking capacity permitted for the output current sink also enhances switching speed for high to low transitions.

In the preferred example embodiment the first output node of the ECL/CML circuit providing the true output signals is coupled to a true output emitter follower transistor element for sourcing the true output signals to a true output and a second cross-control circuit emitter follower transistor element coupled to control the conducting state of the second current switch transistor element. Furthermore, the second output node providing complementary output signals is coupled to a complementary output emitter follower transistor element for sourcing complementary output signals to a complementary output, and a first cross-control circuit emitter follower transistor element coupled to control the conducting state of the first current switch transistor element. The output emitter follower transistor element and cross-control circuit emitter follower transistor element for each pair are coupled together with a common base node coupling to the respective first or second output node of the ECL/CML circuit.

In the preferred example the first cross-control circuit includes the first cross-control circuit emitter follower transistor element, a first resistor element, a first diode element and a control circuit current sink coupled in series. The node between the first resistor element and first diode element is coupled to the first current switch transistor element. The second cross-control circuit comprises the second cross-control circuit emitter follower transistor element, second resistor element, second diode element and the control circuit current sink coupled in series. The node between the second resistor element and second diode element is coupled to the second current switch transistor element.

According to further features of the preferred ECL/CML circuit the output current sink consists of a single current sink coupled to a common emitter node coupling of the first and second current switch transistor elements. The sinking current generated by the output current sink is substantially greater than the sinking current capability of the control circuit current sink and substantially greater than the conventional output current sinks. This is acccomplished by combining both the emitter follower current sinks required in conventional circuits into the single enhanced current sink. As a result of the substantially greater current sinking pulldown capability, the speed of transition from high to low potential at the respective outputs is substantially increased. Furthermore the standby current dissipation is significantly decreased because of the small size of the control circuit current sink. More generally, the crosscontrol circuit provided by the invention for controlling a specified emitter follower current switch at one output includes a cross-control emitter follower transistor element for sourcing current actuated by a signal from the opposite output side of the ECL/CML gate. A potential difference circuit component such as a diode or resistor couples the cross-control circuit emitter follower transistor element to the current switch transistor element associated with the opposite output. As a result of the cross-control circuits, the emitter follower current switches associated with respective outputs are controlled by signals in phase with the signal at the opposite output.

According to the general concept, the invention provides an emitter follower current switch circuit operatively coupled between an output emitter follower transistor element of a bipolar or current mode logic circuit and the corresponding current sink. The emitter follower current switch circuit is constructed and arranged for substantially disconnecting the output current sink from the output emitter follower when the output is at high potential. The emitter follower current switch is provided by a current switch transistor element coupled between the output emitter follower transistor element and the respective current sink. A control circuit controls the conducting state of the current switch transistor element according to the desired phase relationship.

Other objects, features and advantages of the invention are apparent in the following specification and accompanying drawings.

DESCRIPTION OF THE PREFERRED EXAMPLE EMBODIMENTS AND BEST MODE OF THE INVENTION

Figure 1:
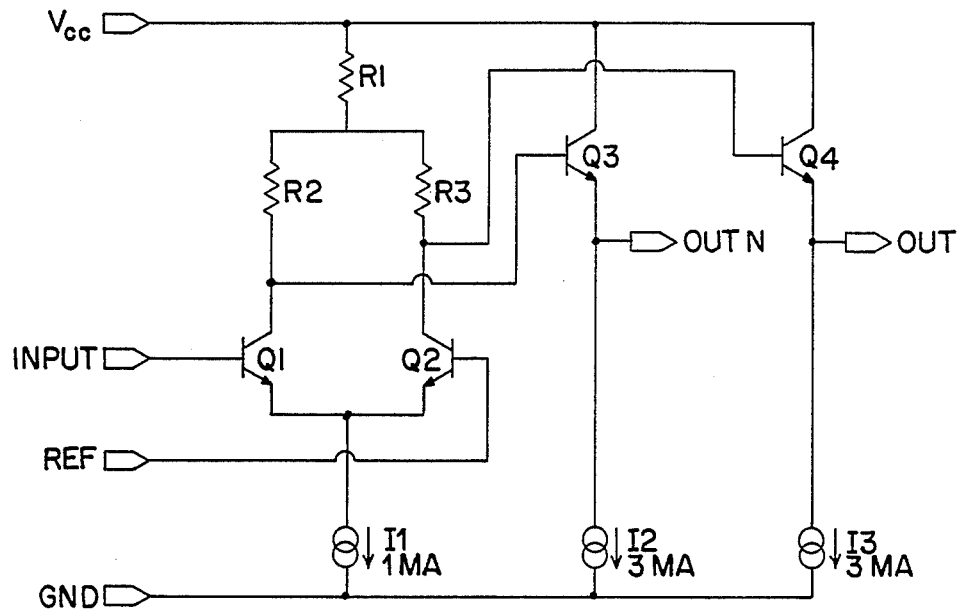
FIG. 1 is a schematic circuit diagram of a prior art ECL/CML output gate with output buffer emitter follower transistor elements.
Figure 2:
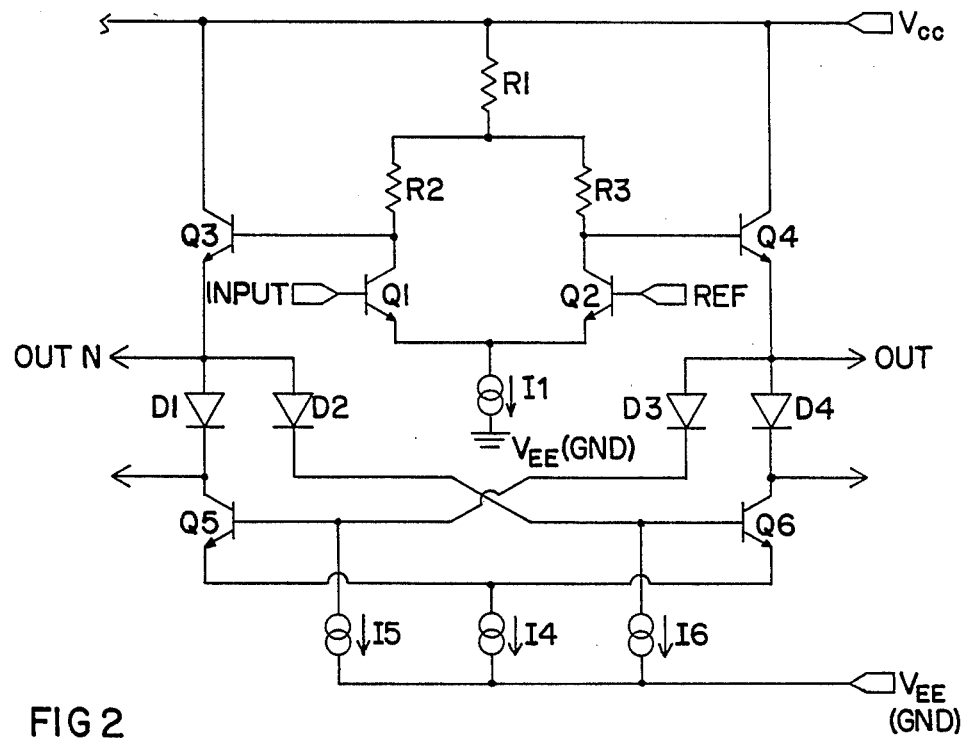
FIG. 2 is a schematic circuit diagram of an improved ECL/CML circuit according to the invention with emitter follower current switch circuits incorporated in the ECL/CML gate.

An ECL/CML gate incorporating the basic emitter follower current switch circuit of the present invention is illustrated in FIG. 2. The circuit components in common with the standard ECL/CML gate of FIG. 1 and performing substantially the same function described above are indicated by the same reference designations. In addition to these components, the emitter follower current switch circuit adds a first current switch transistor element Q6 between the first or true output emitter follower transistor element Q4 and output current sink I4. Transistor element Q6 switches true output signals of high and low potential to the true output OUT. A first control circuit controls the conducting state of the first current switch transistor element Q6 and is coupled to the base node of transistor element Q6. The first control circuit is provided by the diode D2 coupling between the emitter node of the second or complementary output emitter follower transistor element Q3 and the base node of first current switch transistor element Q6. Transistor element Q3 sources complementary output signals of high and low potential to the complementary output OUTN. A small capacity control circuit current sink I6 is coupled between the base node of transistor element Q6 and low potential $V_{ee}$, in this example ground potential GND. Current sink I6 discharges the base and turns off the first current switch transistor element Q6.

Because the first control circuit controls the conducting state of the first current switch transistor element Q6 at the true output OUT with control signals having complementary output signal potential levels from the complementary output side of the ECL/CML gate, the first control circuit is also referred to herein as a first cross-control circuit. Blocking diode D1 prevents the first cross-control circuit of FIG. 2 from interfering in the complementary output side of the ECL/CML gate as hereafter described.

A second current switch transistor element Q5 is interposed between the second or complementary output emitter follower transistor element Q3 which sources complementary output signals to the complementary output OUTN and the output current sink I4. A second control circuit controls the conducting state of the second current switch transistor element Q5 and is coupled to the base node of Q5. The second control circuit is provided by diode D3 coupling between the emitter node of the first or true output emitter follower transistor element Q4 and the base node of second current switch transistor element Q5. A control circuit current sink I5 is coupled between the base node of the second current switch transistor element Q5 and low potential $V_{ee}$, in this example ground GND.

Because the second control circuit controls the conducting state of the second current switch transistor element Q5 with control signals having true output signal potential levels from the true output side of the ECL/CML gate, the second control circuit is also referred to herein as the second cross-control circuit. Blocking diode D4 prevents the second cross-control circuit from interfering in the true output side of the ECL/CML gate.

The operation of the emitter follower current switch circuit of FIG. 2 is as follows. With a high potential output signal (e.g. logic value 1) at the true output OUT, a low potential output signal (e.g. logic value 0) appears at the complementary output OUTN. The complementary output low potential signal provides the control signal through diode D2 in the first cross-control circuit, and control circuit current sink I6 holds the first current switch transistor element Q6 in the nonconducting or off state. As a result the first or true output emitter follower transistor element Q4 which sources current to the true output OUT for maintaining a high potential level at the true output, is effectively disconnected from the output current sink I4. As a result true output emitter follower transistor element Q4 does not have to satisfy and source current to the output current sink I4. Higher switching speeds are attained during transition from low to high potential at the output because the emitter follower transistor element only pulls up the output and not the output current sink. Steady state power dissipaton is reduced.

The high potential output signal at the true output OUT provides the control signal through diode D3 in the second cross-control circuit at a high potential level sourcing current which satisfies the control circuit current sink I5 and maintains the second current switch transistor element Q5 in the conducting or on state. As a result the complementary sink OUTN is effectively coupled to the output current sink I4 which holds the complementary output OUTN, at low potential.

Upon switching from high to low potential at the true output OUT the complementary output OUTN switches from low to high potential. As a result the first cross-control circuit carries a high potential level signal through diode D2 to the base node of the first current switch transistor element Q6. The true output OUT is effectively coupled to the output current sink I4 for discharging the true output OUT and maintaining the true output, which may be coupled to multiple circuits, at the low potential level.

The low potential level signal at the true output OUT becomes the control signal on the second control circuit carried through diode D3 so that the control circuit current sink I5 discharges the base of the second current switch transistor element Q5 turning off transistor element Q5. As a result the complementary output emitter follower transistor element Q3 which is pulling up the complementary output OUTN and maintaining the complementary output at high potential, is effectively disconnected from the output current sink I4. The complementary output emitter follower transistor element Q3 is not required to pullup and source current for the output current sink I4, thereby increasing switching speed and reducing standby power dissipation.

An advantage of the circuit arrangement FIG. 2 is that the output current sink I4 is provided with a current sink capacity of, for example, 5mA, substantially greater than the current sinking capacity of the output current sink in conventional ECL/CML output gates. This is because the output current sink I4 of FIG. 2 is coupled only to the output at low potential and is effectively disconnected from the output at high potential level. All of the current sinking capability of the output current sink I4 is directed to pulling down the output at low potential without having to sink current from the emitter follower transistor element sourcing current to the output at high potential. It is therefore not necessary to limit the size of the current sink I4 in order to avoid high levels of standby power dissipation. In a comparison of the conventional circuit of FIG. 1 and the circuit of the present invention illustrated in FIG. 2, the output current sinking capacity has therefore been increased from 3 mA to 5 mA while power dissipation is decreased.

At the same time, the current sinking capacity of the control circuit current sinks I5 and I6 which perform a base node control circuit function only, can be minimized. For example in the circuit of FIG. 2 the current sinking capacity of the control circuit current sinks I5 and I6 is, for example, 0.5 mA. The steady state standby power dissipation of the control circuit current sinks I5 and I6 is thereby minimized. Overall it is seen that by incorporation of the emitter follower current switch circuit of the present invention into the ECL/CML circuit, the output emitter follower transistor elements source current for pulling up outputs only without having to satisfy and source current to pull up the output current sink. The current sinking capacity of the output current sink can be maximized to increase switching speed. At the same time, standby current sink power dissipation is shifted to the small control circuit current sinks where the current sinking capacity can be minimized to reduce power dissipation.

Figure 3:
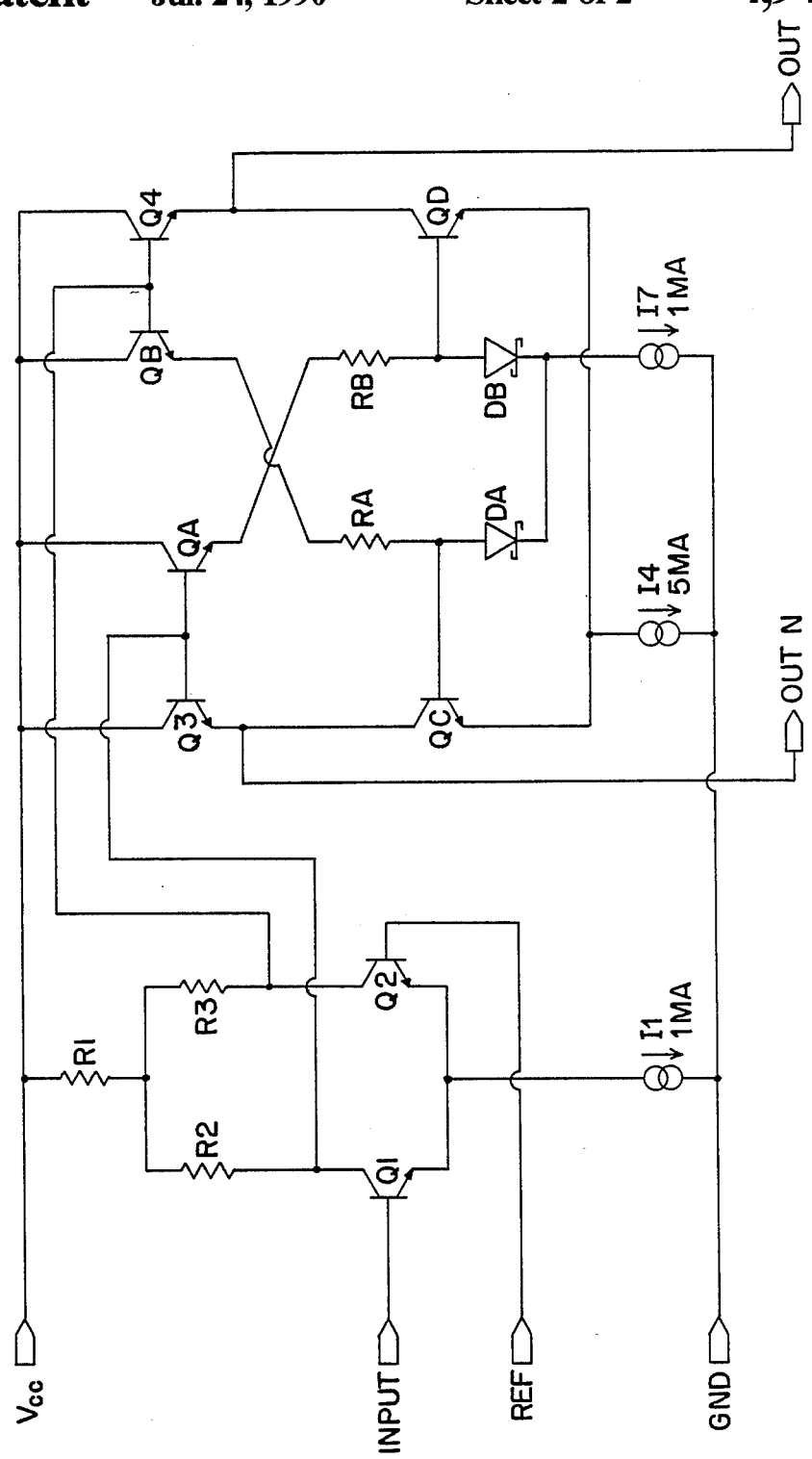
FIG. 3 is a schematic circuit diagram of a preferred embodiment of the ECL/CML gate incorporating emitter follower current switch circuits.

The preferred circuit embodiment of the ECL/CML emitter follower current switch circuit of the invention is illustrated in FIG. 3. The circuit components in common with the circuits of FIGS. 1 and 2 performing substantially the same circuit functions are indicated by the same reference designations. The best mode circuit of FIG. 3 differs from the basic circuit of FIG. 2 in that the emitter follower output buffer functions of sourcing current for pulling up the output and sourcing current to drive the cross-control circuit have been separated. In the ECL/CML circuit of FIG. 3 separate emitter follower transistor elements perform these functions on each side of the ECL/CML gate, that is at both the true and complementary output sides. The separation of these functions with separate emitter follower transistor elements further increases the speed of switching transitions.

As shown in FIG. 3 the first or true output emitter follower transistor element Q4 is paired with a second cross-control circuit emitter follower transistor element QB. Transistor element Q4 serves only as the output buffer emitter follower transistor element for the true output OUT. During transition from low to high potential at the true output OUT and during the steady state high potential level at the true output OUT, the transistor element Q4 sources current to make the transition and maintain the true output level at high potential. The paired emitter follower transistor elements Q4 and QB at the true output side of the ECL/CML gate are coupled together at a common base node coupling.

Second cross-control circuit emitter follower transistor element QB now functions as a component of the second crosscontrol circuit for controlling the conducting state of the second current switch transistor element QC on the complementary output side of the ECL/CML gate. With the true output OUT at high potential, the second cross-control circuit emitter follower transistor element QB delivers a high potential signal in the second cross-control circuit sourcing current through resistor element RA to the base node of the second current switch transistor element QC. At the same time the second cross-control circuit emitter follower transistor element QB sources current satisfying the control circuit I7 through resistor element RA and diode element DA so that the second current switch transistor element QC is turned on and maintained in the conducting state. The complementary output OUTN is therefore connected to the relatively large output current sink I4 through conducting path transistor element QC which maintains the complementary output OUTN at low potential.

The second or complementary output emitter follower transistor element Q3 is paired with a first cross-control circuit emitter follower transistor element QA with a common base node coupling. While the complementary output OUTN is at low potential the second cross-control circuit emitter follower transistor element QA delivers a low potential signal through the second cross-control circuit including resistor element RB to the base node of the first current switch transistor element QD. The control circuit current sink I7 through diode element DB therefore holds the first current switch transistor element QD in the non-conducting or off state. As a result the true output OUT is effectively disconnected from the output current sink I4 while the true output emitter follower transistor element Q4 sources current to the true output OUT for maintaining the high potential level.

Upon transition from high to low potential at the true output OUT, the complementary output OUTN is switching from low to high potential. The true output low potential signal is carried by the second cross-control circuit emitter follower transistor QB through the second cross-control circuit to the base of the second current switch transistor element QC which turns off effectively disconnecting the complementary output OUTN from the output current sink I4. The complementary output emitter follower transistor element Q3 therefore sources current to the complementary output OUTN pulling up the complementary output OUTN to high potential without having to satisfy at the same time the relatively large capacity output current sink I4. The high potential level at the complementary output side of the ECL/CML gate is carried by the first cross-control circuit emitter follower transistor element QA, satisfying the control circuit current sink I7 and turning on the first current switch transistor element QD. As a result the true output OUT is effectively connected to the output current sink I4 which pulls down the true output OUT to low potential.

As illustrated in FIG. 3 a single control circuit current sink I7 is provided for both the first and second crosscontrol circuits by the use of the blocking diodes DA and DB. A relatively small current sinking capacity control circuit current sink is selected to minimize standby power dissipation by the cross-control circuits. For example the control circuit current sink I7 is selected for sinking current of 1mA. On the other hand, the current sinking capacity of the output current sink I4 can be maximized to increase switching speeds without sacrificing current dissipation. For example the output current sink I4 is selected to have a sinking capacity of 5 mA or 6 mA.

While the invention has been described with reference to the incorporation of the emitter follower current switch circuit in ECL/CML gates, it is effective as an emitter follower current switch in ECL, current mode logic, and bipolar circuits generally. The invention is therefore intended to cover all modifications and equivalents within the scope of the following claims.

We claim:

1. An improved emitter coupled logic or current mode logic (ECL/CML) circuit having a first active switching node providing true output signals of high and low potential, first emitter follower transistor means coupled to the first active switching node for sourcing said true output signals to a first output, a second active switching node providing complementary output signals of low and high potential, second emitter follower transistor means coupled to the second active switching node for sourcing said complementary output signals to a second output, and output current sink means operatively coupled for sinking current from the first and second outputs and first and second emitter follower transistor means, the improvement comprising:

an emitter follower current switch circuit comprising a first current switch transistor element operatively coupled between the first emitter follower transistor means and the output current sink means and a second current switch transistor element operatively coupled between the second emitter follower transistor means and said output current sink means;

a first control circuit arranged and coupled for controlling the conducting state of the first current switch transistor element so that it is on and off for true output signals of low and high potential respectively, said first emitter follower transistor means and output thereby being substantially disconnected from the output current sink means when the first output is at high potential;

a second control circuit arranged and coupled for controlling the conducting state of the second current switch transistor element so that it is on and off (non conducting) for true output signals of high and low potential respectively, said second emitter follower transistor means and second output thereby being substantially disconnected from the output current sink means when the second output is at high potential;

said first control circuit comprising a first potential difference circuit element operatively coupled between the emitter node of the second emitter follower transistor means and the base node of the first current switch transistor element and said second control circuit comprising a second potential difference circuit element operatively coupled between the emitter node of the first emitter follower transistor means and the base node of the second current switch transistor element.

2. The ECL/CML circuit of claim 1 wherein the first emitter follower transistor means comprises a first emitter follower transistor element for sourcing true output signals of high and low potential to the first output and a second control circuit emitter follower transistor element coupled in the second control circuit for the controlling the conducting state of the second current switch transistor element, and wherein the second emitter follower transistor means comprises a second emitter follower transistor element operatively coupled for sourcing the complementary output signals of low and high potential to the second output and a first control circuit emitter follower transistor element operatively coupled in the first control circuit for controlling the conducting state of the first current switch transistor element.

3. The ECL/CML circuit of claim 2 wherein the first control circuit comprises a first potential difference circuit element coupling the emitter node of the first control circuit emitter follower transistor element to the base node of the first current switch transistor element and wherein the second control Circuit comprises a second potential difference circuit element operatively coupling the emitter node of the second control circuit emitter follower transistor element to the base node of the second current switch transistor element.

4. The ECL/CML circuit of claim 2 further comprising control circuit current sink means operatively coupled for sinking current from the first and second control circuit current sink means also being operatively coupled to base nodes of the first and second current switch transistor elements for discharging the respective bases of the first and second current switch transistor elements.

5. The ECL/CML circuit of claim 4 wherein the current sinking capacity of the output current sink means is substantially greater than the current sinking capacity of the control circuit sink means.

6. An improved emitter coupled logic or current mode logic (ECL/CML) circuit having active switching first and second output nodes respectively providing true and complementary output signals of high and low potential, output buffer first and second emitter follower transistor means operatively coupled respectively to the first and second output nodes for sourcing said output signals to respective true and complementary outputs, and output current sink means operatively coupled for sinking current respectively from the true output and first emitter follower transistor means and from the complementary output and second emitter follower transistor means, the improvement comprising:

first current switch transistor element operatively coupled between the first emitter follower transistor means said output current sink means;

first cross-control circuit coupled between the emitter node of the second emitter follower transistor means and the base node of the first current switch transistor element for controlling the conducting state of the first current switch transistor element so that it is on (conducting) and off (non-conducting) for complementary output signals of high and low potential respectively;

second current switch transistor element operatively coupled between the second emitter follower transistor means and said output current sink means;

and second cross-control circuit coupled between the emitter node of the first emitter follower transistor means and the base node of the second current switch transistor element for controlling the conducting state of the second current switch transistor element so that it is on (conducting) and off (non-conducting) for true output signals of high and low potential respectively;

said first emitter follower transistor means comprising a true output emitter follower transistor element coupled to the true output and a second cross-control circuit emitter follower transistor element coupled to control the conducting state of the second current switch transistor element, and said second emitter follower transistor means comprising a complementary output emitter follower transistor element coupled to the complementary output and a first cross-control circuit emitter follower transistor element coupled to control the conducting state of the first current switch transistor element, the output emitter follower transistor element and cross-control circuit emitter follower transistor element of each emitter follower transistor means being coupled together with a common base node coupling to the respective first or second output node of the ECL/CML circuit.

7. The ECL/CML circuit of claim 6 wherein the first cross-control circuit comprises the first cross-control circuit emitter follower transistor element, a first resistor element, a first diode element, and control circuit current sink means coupled in series, the node between said first resistor element and first diode element being coupled to the second current switch transistor element and wherein the second cross-control circuit comprises said second cross-control circuit emitter follower transistor element, second resistor element, second diode element and control circuit current sink means coupled in series, the node between the second resistor element and second diode element being coupled to the first current switch transistor element.

8. The ECL/CML circuit of claim 7 wherein the sinking current generated by the output current sink means is substantially greater than the sinking current generated by the control circuit current sink means.

9. The ECL/CML circuit of claim 7 wherein the output current sink means comprises a single current sink coupled current switch transistor elements.

* * * * *